United States Patent [19]

Kiyozuka

[11] Patent Number: 4,672,237
[45] Date of Patent: Jun. 9, 1987

[54] LOGIC CIRCUIT HAVING DELAY TIME FREE FROM TEMPERATURE AFFECTION

[75] Inventor: Noboru Kiyozuka, Tokyo, Japan

[73] Assignee: NEC Corporation, Tokyo, Japan

[21] Appl. No.: 703,472

[22] Filed: Feb. 20, 1985

[30] Foreign Application Priority Data

Feb. 21, 1984 [JP] Japan ............................ 59-30661

[51] Int. Cl.⁴ .................................... H03K 17/14
[52] U.S. Cl. .................................... 307/310; 307/443; 307/455; 307/491; 307/494
[58] Field of Search ............... 307/443, 455, 491, 494, 307/591, 297, 310, 454, 200 A; 357/59

[56] References Cited

U.S. PATENT DOCUMENTS

| | | | |
|---|---|---|---|
| 4,063,210 | 12/1977 | Coliver | 357/59 X |
| 4,243,948 | 1/1981 | Schade, Jr. | 307/491 X |
| 4,249,091 | 2/1981 | Yamagiwa | 307/455 |
| 4,348,633 | 9/1982 | Davis | 307/310 X |
| 4,424,461 | 1/1984 | Taguchi et al. | 307/491 |
| 4,591,743 | 5/1986 | Kung | 307/494 X |

FOREIGN PATENT DOCUMENTS 0130240  10/1980  Japan .............................. 307/455

OTHER PUBLICATIONS

Giacomo, "Noise Immunity in Current Mode Logic Gates", RCA Tech Notes, TN No. 677, Jun. 1966.

Primary Examiner—Stanley D. Miller
Assistant Examiner—D. R. Hudspeth
Attorney, Agent, or Firm—Burns, Doane, Swecker & Mathis

[57] ABSTRACT

A logic circuit such as an emitter coupled logic includes a current switch section formed of transistors and resistors and comparing an input signal with a reference voltage and an output section formed of at least a transistor and a resistor and producing an output signal in response to the comparison result, the resistors in the current switch section being polycrystalline resistors, for example, having a negative temperature coefficient of resistance whose sign is opposite to that of the resistor, for example a diffused resistor, having a positive temperature coefficient in the output section.

15 Claims, 9 Drawing Figures

LOGIC CIRCUIT HAVING DELAY TIME FREE FROM TEMPERATURE AFFECTION

BACKGROUND OF THE INVENTION

1. Field of the Invention:

The present invention relates to a logic circuit, and more particularly to an ECL (Emitter Coupled Logic) circuit suitable for being formed in a semiconductor substrate.

2. Description of the Prior Art:

The ECL circuit in the prior art is formed of a current switch section receiving an input logic signal and an emitter follower output section. The current switch section includes a reference transistor, at least one switching transistor having an emitter connected to the emitter of the reference transistor, and a current source transistor connected to the commonly connected emitters of the reference and switching transistors. The base(s) of the switching transistor(s) receives the input logic signal(s) and the base of the reference transistor is held at a reference voltage generated from a first constant voltage source. The base of the current source transistor is held at another constant voltage generated from a second constant voltage source. By the suitable circuit arrangement of the second constant voltage source, the constant voltage can be made free from temperature variation. The small variation of the reference voltage does not affect the operating current. Thus, the operating current is not changed by the change in the reference and constant voltages.

The current switch section of the ECL circuit further includes a first load resistor connected to the collector of the reference transistor, a second load resistor connected in common to the collector(s) of the switching transistor(s), and an emitter resistor of the current source transistor. The ECL circuit further comprises an emitter-follower transistor having a base connected to an output node between the second load and the switching transistor(s) and an emitter resistor thereof, in the emitter follower output section. The resistances of those four resistors employed in the ECL circuit have temperature dependency which is not compensated by circuit arrangement. For example, the diffusion resistor formed by an impurity diffusion into a semiconductor substrate has a positive temperatre coefficient. Therefore, if the operating temperature changes, the current flowing through the ECL circuit changes. More specifically, if the resistors have a positive temperature dependency, the operating current decreases with an increase in temperature.

Generally, transistor circuit has such tendency that the delay time of the output signal from the input signal becomes large as the operating current decreases. Therefore, the ECL circuit has a drawback that the delay time depends on the operating temperature. Furthermore, since the operating temperature changes by ambient temperature and operating condition, the time delay is unstable and unpredictable. Due to the instability of operating current, power consumption is also unstable and unpredictable. These facts make the system design difficult.

SUMMARY OF THE INVENTION

The primary object of the present invention is to provide a logic circuit having a delay time free from an affection from the variation in the operating temperature.

Another object of the present invention is to provide a logic circuit having little temperature dependency of total power consumption.

Still another object of the present invention is to provide a logic circuit which is capable of making the system design easy and suitable for being formed in a semiconductor integrated circuit.

According to the present invention, there is provided a logic circuit comprising a current switch section formed of transistors and resistors and receiving an input logic signal to be compared with a reference voltage and an output section formed of at least a transistor and a resistor and producing an output signal in response to the output from the current switch section, the resistors in the current switch section having resistances of a negative or positive temperature coefficient, the negative or positive sign thereof being opposite so that of the temperature coefficient of the resistor in the output section. The current switch section is preferably of an emitter-coupled type and uses polycrystalline resistors as the resistors. The output section is preferably an emitter follower stage and uses a diffused resistor as the resistor.

The present invention makes the sign of the temperature coefficient of the resistor different between that in the current switch section and that in the output section. Therefore, when the operating temperature changes, the changes in the currents flowing through the current switch section and the output section are opposite to each other. Thus, the change in the total power consumption becomes very small by the mutual compensation. For the same reason, the change in the time delay of the output signal also becomes very small.

Thus, the logic circuit of the present invention has stable and predictable total power consumption and time delay of output signal. Since a semiconductor integrated circuit has a limited power consumption, the stable and predictable total power consumption is convenient for the design of a semiconductor integrated circuit using the logic circuit of the present invention. Since a matching of signal timing is important in logic systems, the stable and predictable time delay of output signal facilitates the design of a system using the logic circuit of the present invention.

Furthermore, the resistors having negative and positive temperature coefficients are easily achieved by using diffused resistor and polycrystalline resistor. These resistors may be formed on a semiconductor chip through ordinary manufacturing process. Thus, the logic circuit of the present invention is suitable for being formed in a semiconductor integrated circuit.

BRIEF DESCRIPTION OF THE DRAWINGS

The above and further objects, features and advantages of the present invention will become more apparent from the following detailed description taken in conjunction with the accompanying drawings, wherein.

Figure 1:
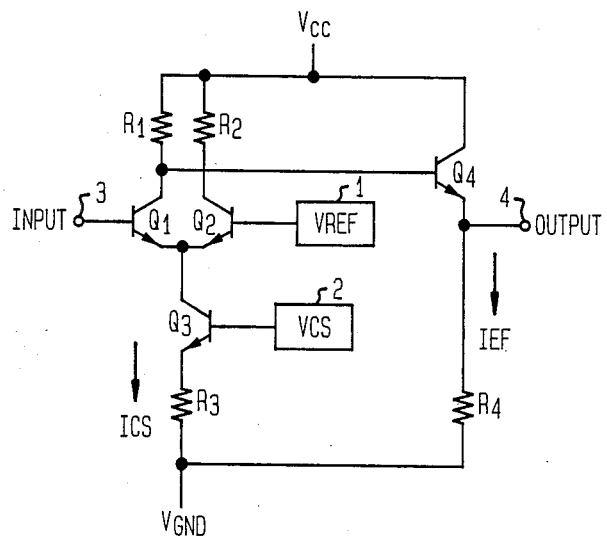
FIG. 1 is a circuit diagram of an ECL circuit in the prior art.

The ECL circuit in the prior art is shown in FIG. 1 and composed of a current switch section including a reference transistor $Q_2$, at least one switching transistor $Q_1$, a current source transistor $Q_3$, a first and second load resistors $R_2$ and $R_1$ and an emitter resistor $R_3$, a first constant voltage source 1 generating a reference voltage $V_{REF}$ and a second constant voltage source 2 generating a constant voltage $V_{cs}$ and an emitter follower output section including a transistor $Q_4$ and a resistor $R_4$. The current source transistor $Q_3$ has a base receiving the constant voltage $V_{cs}$ and an emitter connected with the emitter resistor $R_3$ and constitutes a current source. The switching and reference transistors $Q_1$ and $Q_2$ have emitters connected in common to the collector of the current source transistor $Q_3$ and collectors connected respectively to the second and first load resistors $R_1$ and $R_2$. An input logic signal is applied to the base of the switching transistor $Q_1$ through an input terminal 3. The reference voltage $V_{REF}$ is applied to the base of the reference transistor $Q_2$. The input signal is compared with the reference voltage $V_{REF}$. A result of the comparison is derived at the connection point between the collector of the switching transistor $Q_1$ and the second load $R_1$ and applied to the base of the emitter follower transistor $Q_4$. The final output signal is produced at an output terminal 4 through the emitter of the transistor $Q_4$.

The second constant voltage source 2 is generally arranged to produce a constant voltage $V_{cs}$ free from the temperature variation. By such arrangement, the ECL circuit produces an output signal having a constant logical amplitude. In other words, the operating current is kept constant by the stable and constant voltage $V_{cs}$. The small variation of the reference voltage $V_{REF}$ changes a comparison reference of the input logic signal but does not affect the operating current.

However, resistance values of the resistors used in the ECL circuit have temperature dependencies. When the ECL circuit is formed in a semiconductor integrated circuit, the resistors are formed as diffused resistors which use impurity-diffused regions. Such diffused resistors have resistances of positive temperature coefficient. With the increment of temperature, their resistance values increase.

While the base of the transistor $Q_3$ is held at a stable and constant voltage $V_{cs}$, the resistance of the resistor $R_3$ connected at the emitter of the transistor $Q_3$ has a positive temperature coefficient. Therefore, the operating current $I_{cs}$ of the switching section decreases when the operating temperature rises. Similarly, the operating current $I_{EF}$ of the emitter follower output section is affected by the tempeature coefficient of the resistance of the resistors $R_4$, $R_3$ and $R_1$. These relationship can be expressed by the following equations (1) and (2).

$$I_{cs} = \frac{V_{cs} - V_F}{R_3(1 + \Delta T_j \times \alpha)} \quad (1)$$

$$I_{EF} = \frac{V_{cc} - V_F - 0.5 V_L}{R_4(1 + \Delta T_j \times \alpha)} \quad (2)$$

where:

$V_{cc}$..., a power voltage;

$V_F$... a base-emitter voltage of transistors $Q_3$ and $Q_4$;

$V_L$... a logical amplitude which nearly equals $$\frac{V_{cs} - V_F}{R_3} \times R_1;$$

$\Delta T_j$... an increment of operating temperature;

$\alpha$... a temperature coefficient of resistances of the resistors;

$R_4, R_3, R_1$... resistances of the resistors $R_4$, $R_3$ and $R_1$.

Figure 2:
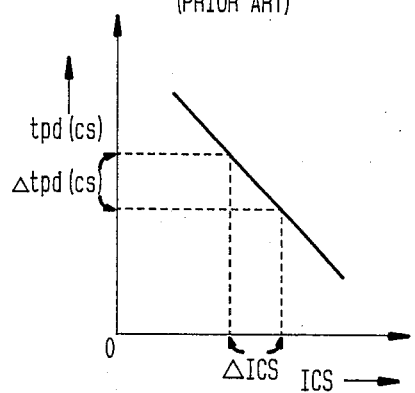
FIG. 2 is a graphic view for explaining the relationship between the current flowing though the current switch section of FIG. 1 and the time delay of the output therefrom.
Figure 3:
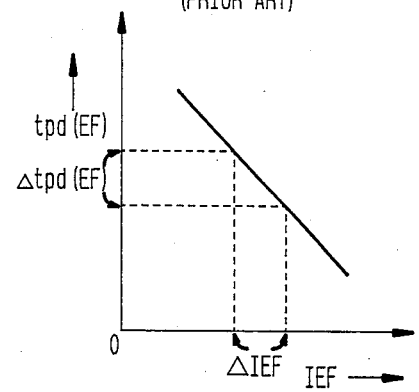
FIG. 3 is a graphic view for explaining the relationship between the current flowing through the emitter follower output section of FIG. 1 and the time delay of output therefrom.

The time delays at the current switch section and the emitter follower output section increase with decrements of operating currents $I_{cs}$ and $I_{EF}$, as shown in FIGS. 2 and 3. That is, in the respective sections, the operating currents decrease as the operating temperature increases, causing enlarged delay times in the respective sections. These respective delay times are accumulated in the delay time of the final output signal. since the delay times depend on the operatng temperature, the delay time of the final output is unstable and unpredictable in actual operating condition. Therefore, the design of logical system using such ECL circuits encounters difficulty in matching the signal timing.

The temperature dependencies of the operating currents is another cause of unstable and unpredictable power consumption. Especially, the allowable power consumption in a semiconductor integrated circuit is limited. Therefore, the unstable and unpredictable power consumption makes the design of the semiconductor integrated circuit using such ECL circuits difficult. Thus, the ECL circuit in the prior art is not suitable for being formed in a semiconductor integrtated circuit.

DESCRIPTION OF THE PREFERRED EMBODIMENT

Figure 4:
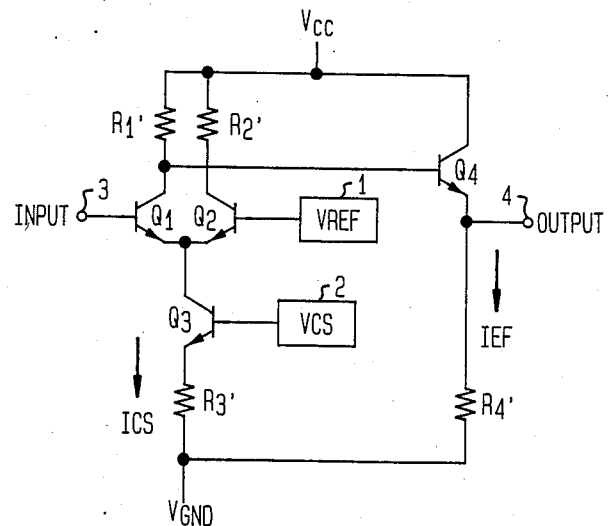
FIG. 4 is a circuit diagram of an embodiment according to the present invention.
Figure 7:
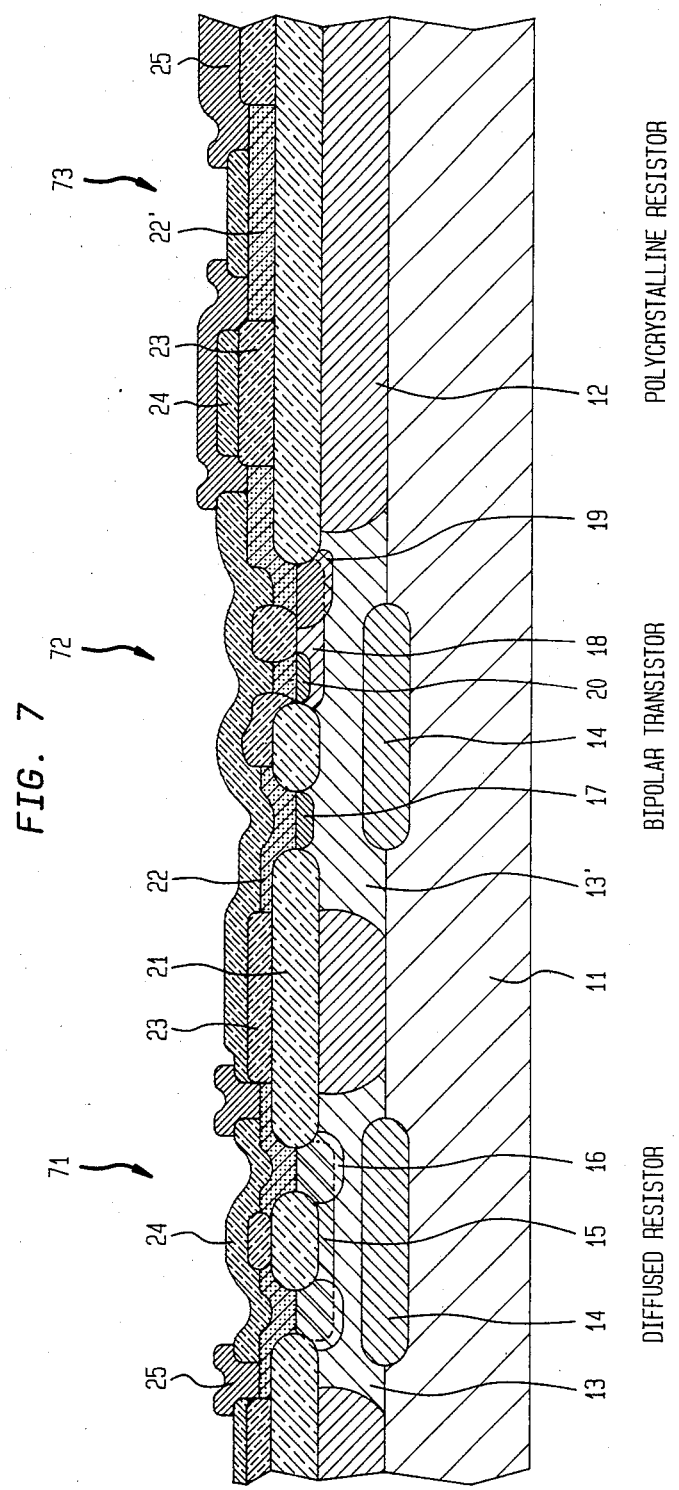
FIG. 7 is a sectional view of circuit elements formed in a semiconductor integrated circuit and used in the embodiment of the present invention.

FIG. 4 shows a embodiment of the present invention which has a circuit similar to the ECL circuit shown in FIG. 1. The difference is in that the resistors $R_1'$, $R_2'$ and $R_3'$ in the current switch section are formed in a semiconductor integrated circuit by using polycrystalline silicon layers deposited on the silicon chip, while the resistor $R_4'$ in the emitter follower output section is formed by using an impurity-diffused region formed in the single crystal region of the silicon chip. As a result, the former resistors have a negative temperature coefficient and the latter resistor has a positive one. Those resistors $R_1'$, $R_2'$ and $R_3'$ and the resistor $R_4'$ are shown in FIG. 7 which will be explained later.

Figure 5:
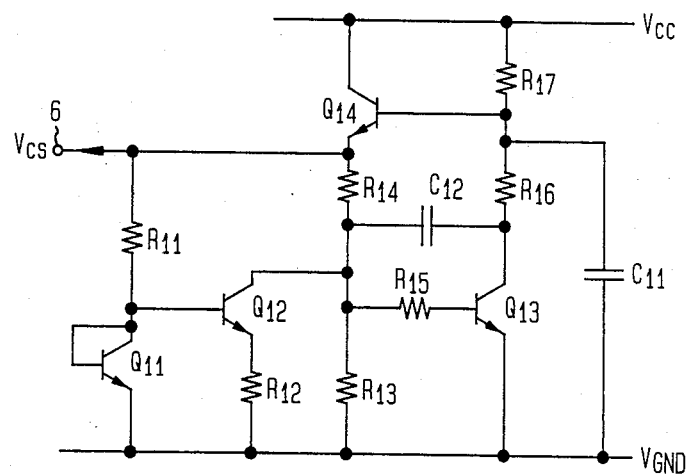
FIG. 5 is a circuit diagram of an example of the second constant voltage generator.

An example of the second constant voltage source 2 is shown in FIG. 5. A diode-connected transistor $Q_{11}$ and a resistor $R_{11}$ are serially connected between the output terminal 6 of the constant voltage $V_{cs}$ and the ground line ($V_{GND}$). In parallel with the diode-connected transistor $Q_{11}$, a series connection of a base-emitter junction of a transistor $Q_{12}$ and a resistor $R_{12}$ is connected. The collector of the transistor $Q_{12}$ is connected with resistors $R_{13}$, $R_{14}$ and $R_{15}$ and a capacitor $C_{12}$. The other end of the resistor $R_{13}$ is grounded. A base-emitter junction of a transistor $Q_{13}$ is connected between the other end of the resistor $R_{15}$ and the ground line ($V_{GND}$). The capacitor $C_{12}$ is connected in parallel with the resistor $R_{15}$ and the base-collector junction of the transistor $Q_{13}$. The other end of the resistor $R_{14}$ s connected with the output terminal 6 and an emitter of a transistor $Q_{14}$ having a collector connected with the power line ($V_{cc}$) and a base connected with resistors $R_{16}$ and $R_{17}$ and a capacitor $C_{11}$. The other end of the resistor $R_{16}$ is connected with the collector of the transistor $Q_{13}$ and the capacitor $C_{12}$. The other end of the resistor $R_{17}$ is connected with the power line ($V_{cc}$). The other end of the capacitor is grounded to the ground line ($V_{GND}$). The constant voltage $V_{cs}$ produced at the output terminal 6 has no temperature coefficient.

Figure 6:
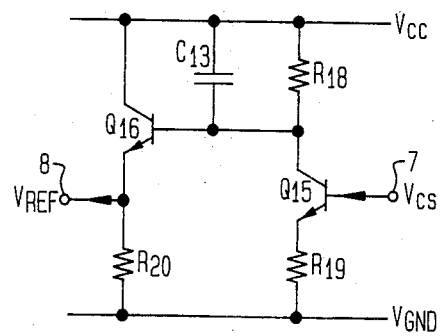
FIG. 6 is a circuit diagram of an example of the second constant voltage generator.

An example of the first constant voltage source shown in FIG. 6 uses the constant voltage $V_{cs}$ produced from the second constant voltage source 2 and applied through an input terminal 7. The constant voltage $V_{cs}$ is applied to a base of a transistor $Q_{15}$ which has an emitter grounded through a resistor $R_{19}$ and a collector connected to the power line ($V_{cc}$) through a parallel connection of a resistor $R_{18}$ and a capacitor $C_{13}$. The voltage obtained at the collector of the transistor $Q_{15}$ is applied to a base of a transistor $Q_{16}$ having a collector connected to the power line ($V_{cc}$) and an emitter connected to a resistor $R_{20}$ and an output terminal 8. The other end of the resistor $R_{20}$ is grounded to the ground line ($V_{GND}$). Since the reference voltage $V_{REF}$ obtained at the output terminal 8 is produced from the constant voltage $V_{cs}$ which has no temperature coefficient, the temperature coefficient of the reference voltage $V_{REF}$ is very small.

By use of those examples of the first and second constant voltage generators 1 and 2, the operating currents flowing through the ECL circuit shown in FIG. 4 may not depend on the temperature dependencies of the reference voltage $V_{REF}$ and the constant voltage $V_{cs}$. Another cause of the temperature dependency of the operating currents is the temperature coefficients of the resistors $R_1'$ through $R_4'$. In accordance with the embodiment shown in FIG. 4, the resistors $R_1'$, $R_2'$ and $R_3'$ are polycrystalline resistors having resistances of a negative temperature coefficient and the resistor $R_4'$ is a diffused resistor having a resistance of a positive temperature coefficient.

Those polycrstalline resistors and diffused resistor may be formed as shown in FIG. 7. On a P-type silicon substrate 11, N+-type buried layers 14 and an N-type epitaxial layer are formed. The N-type epitaxial layer is divided into a plurality of N-type regions 13 and 13' by a formation of a P+-type isolation region. In one of the N-type region 13', a bipolar transistor 72 is formed by diffusing an N+-type collector contact region 17, a P-type base region 18, a P+-type base contact region 19 and an N+-type emitter region 20. A thick $SiO_2$ layer 21 is formed outside the element regions and between the N+-collector contact region 17 and the P-type base region 18. The thick $SiO_2$ layer 21 is produced by a thermal oxidation. The electrodes of emitter, base and collector are led out by a doped polycrystalline layer 22. The doped polycrystalline layer is once formed all over the surface, and then undesired part of the polycrystalline layer except for the wiring regions and polycrystalline resistor regions are converted into $SiO_2$ layer 23 by the selective thermal oxidation. On the polycrystalline layers 22 and the $SiO_2$ layer 23, another $SiO_2$ layer 24 is deposited by a process of vapor deposition.

The diffused resistor 71 is formed in the N-type region 13 which is a single crystal region. A P-type region 15 having a sheet resistance of 8 $K\Omega/\square$ is formed in the N-type region 13. At two separated portions of the P-type region 15, P+-regions 16 are formed for contacting with the doped polycrystalline layers 22. The interconnection with other circuit elements is made by Al wiring layers 25. The diffused resistor 71 has a resistance of positive temperature coefficient which mainly depends on the sheet resistance of the P-type region 15.

The polycrystalline resistor 73 is formed by the doped polycrystalline layer 22' having a sheet resistance of 4 $K\Omega/\square$ and deposited on the $SiO_2$ layer 21. The doped polycrystalline layer 22' is deposited simltaneously with other doped poycrystalline layer 22. The interconnection with other circuit elements is made by Al wiring layers 25. The polycrystalline resistor 73 has a resistance of negative sign temperature coefficient, if the sheet resistance of the doped polycrystalline layer 22' is larger than a few hundreds ohms/$\square$. Pratically, the sheet resistance is selected more than three hundreds ohms/$\square$ for the resistors having a negative sign temperature coefficient of resistance. For obtaining a positive sign temperature coefficient of resistance, the sheet resistance is selected as lower than 100 ohms/$\square$.

Turning back to FIG. 4, when the operating temperature rises by $\Delta T(°C.)$, it changes operating current $I'_{cs}$ at the current switch section of transistors $Q_1$, $Q_2$ and $Q_3$ and the operating currents $I'_{EF}$ at the emitter follower output section. The changing values $\Delta I'_{cs}$ and $\Delta I'_{EF}$ of the operating currents $I'_{cs}$ and $I'_{EF}$ are as follows;

$$\Delta I'_{cs} = \left( \frac{V_{cs} - V_F}{R_3} \right) \left( \frac{\alpha \cdot \Delta T}{1 + \alpha \cdot T} \right) \qquad (3)$$

$$\Delta I'_{EF} = \left( \frac{V_{cc} - V_F - 0.5 V_L}{R_4} \right) \left( \frac{\beta \cdot \Delta T}{1 + \beta \cdot T} \right) \qquad (4)$$

where,
  $\alpha$ is a temperature coefficient of resistances of the resistors $R_1$, $R_2$ and $R_3$ and $\beta$ is that of the resistor $R_4$.

Figure 8:
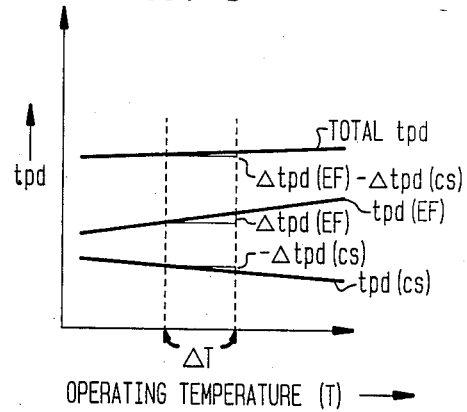
FIG. 8 is a graphic view for explaining the relationship between the signal time delays in the respective sections and the whole circuit and the operating temperature.

According to this embodiment, since the signs of the temperature coefficients "$\alpha$" and "$\beta$" are respectively negative and positive, the operating currents $I'_{cs}$ and $I'_{EF}$ increase and decrease, respectively. The time delay tpd(cs) of the signal at the current switch section becomes short, while the time delay tpd(EF) of signal at the emitter follower output section becomes long. The change in total time delay becomes small as exemplarily shown in FIG. 8. Since the total time delay does not change widely by temperature variation, the circuit design using the ECL circuit becomes very easy.

The power consumption will now be explained. The total power consumption $P_W$ can be expressed as follows;

$$P_W = (I'_{EF} + I'_{cs}) \times V_{cc} \qquad \ldots (5)$$

When the operating temperature rises by ΔT, the total power consumption P'$_W$ changes as follows;

$$P_W = \{(I'_{EF} - \Delta I'_{EF}) + (I'_{cs} + \Delta I'_{cs})\} \times V_{cc} \quad (6)$$

The change in power consumption ΔP$_W$ is as follows;

$$\Delta P_W = (-\Delta I'_{EF} + \Delta I_{cs}) \times V_{cc} \quad (7)$$

Figure 9:
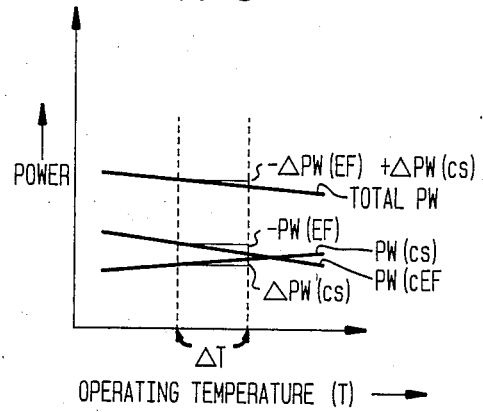
FIG. 9 is a graphic view for explaining the relationship between the power dissipation in the respective sections and the whole circuit and the operating temperature.

These relationships between the power consumption and the temperature change in the respective sections and the whole circuit are shown in FIG. 9 in which P$_{W(cs)}$ and P$_{W(EF)}$ are power consumptions in the current switch section and the emitter follower output section. The ECL circuit of the present invention does not change widely its power consumption and is suited for use in a semiconductor integrated circuit in which the allowable power consumption is limited.

The temperature coefficients of the resistances of the diffused resistor and the polycrystalline resistor may be controlled by sheet resistances in the diffused region 15 and the polycrystalline layer 22'. Therefore, the controls of the time delay and the power consumption may be achieved by the normal techniques used in a semiconductor integrated circuit. Furthermore, by adjusting those sheet resistances, the temperature dependencies of the signal time delay and the power consumption may be made zero.

Although the diffused resistor having a resistance of positive temperature coefficient and the polycrystalline resistor having a resistance of negative temperature coefficient are respectively used in the emitter follower output section and the current switch section, they may be reversely used. That is, the diffused resistor and the polycrystalline resistor may be respectively used in the current switch section and the emitter follower output section and even in that case, the changes in total signal time delay and the whole power consumption are equally made small or zero. The temperature coefficient of the resistance of the polycrystalline resistor can be controlled from negative to positive by adjusting its sheet resistance. Therefore, the resistors in both of the current switch section and the emitter follower output section may be made with polycrystalline resistors only. That is, the resistor(s) used in one of the sections is the polycrystalline resistor(s) made by a polycrystalline layer having a sheet resistance smaller than 100 ohms/□, and the resistor(s) used in the other section is that made by a polycrystalline layer having a sheet resistance larger than 300 ohms/□. It is obvious to the skilled in the art that the base of the transistor Q$_4$ in FIG. 4 may be connected with the collector of not the switching transistor but the reference transistor Q$_2$ to obtain an inverted output signal.

What is claimed is:

1. A logic circuit comprising:
   first means for receiving a reference voltage;
   second means for receiving an input signal;
   a comparator section coupled with said first and second means comparing said input signal with said reference voltage to produce an output as a result of the comparison, said comparator section including a first type of resistor which has a resistance of temperature coefficient of a first sign, a first current flowing through said comparator section and said first type of resistor; and
   an output section receiving said output from said comparator section to produce an output signal in response to the received output, said output section including a second type of resistor having a resistance of temperature coefficient of a second sign which is opposite to said first sign, a second current flowing through said output section and said second type of resistor;
   whereby a total current of said first and second currents is stabilized with respect to a change in operating temperature.

2. A logic circuit as claimed in claim 1, wherein said comparator section includes a first transistor having a base receiving said input signal, a second transistor having a base receiving said reference voltage and a current source supplying a substantially constant current to emitters of said first and second transistors and said output section includes an emitter follower circuit.

3. A logic circuit as claimed in claim 1, wherein one of said first and second types of resistors is a single crystal resistor into which impurities are introduced and the other is a polycrystalline resistor into which impurities are introduced.

4. A logic circuit as claimed in claim 2, wherein one of said first and second types of resistors is a single crystal resistor into which impurities are introduced and the other is a polycrystalline resistor into which impurities are introduced.

5. A logic circuit as claimed in claim 2, wherein said comparator section and said output section are formed on a semiconductor substrate, said first type of resistor being made of a region of polycrystalline semiconductor formed on said semiconductor substrate and doped with impurities, and said second type of resistor being made of a region of single crystal semiconductor into which impurities are diffused.

6. A logic circuit as claimed in claim 5, wherein said semiconductor substrate and said single crystal semiconductor are silicon and said polycrystalline semiconductor is a polycrystalline silicon.

7. A logic circuit as claimed in claim 6, wherein said polycrystalline semiconductor has a sheet resistivity more than 300 ohms/□.

8. A logic circuit comprising:
   an input signal receiving an input signal;
   first and second power lines;
   a first transistor having a base connected to said input terminal, an emitter and a collector;
   a first resistor connected between said collector of said first transistor and said first power line, said first resistor having a resistance of one of positive and negative temperature coefficients;
   a reference voltage source;
   a second transistor having a base connected to said reference voltage source to receive a reference voltage, an emitter connected in common to said emitter of said first transistor and a collector;
   a second resistor connected between said collector of said second transistor and said first power line, said second resistor having a resistance of said one of positive and negative temperature coefficients;
   a current source supplying an operating current to said emitters of said first and second transistors;
   a third transistor having a base connected to one of said collectors of said first and second transistors, a collector connected to said first power line, and an emitter;
   a third resistor connected between said emitter of said third transistor and said second power line, said third resistor having a resistance of the other of said positive and negative temperature coefficients; and an output terminal connected to receive an output signal from said emitter of said third transistor.

9. A logic circuit as claimed in claim 8, wherein said first, second and third transistors, said first, second and third resistors and said current source are formed on a semiconductor chip in a form of semiconductor integratged circuit, said first and second resistors being formed in a polycrystalline semiconductor layer formed on said semiconductor chip, and said third resistor being formed in said semiconductor chip.

10. A logic circuit as claimed in claim 9, wherein said polycrystalline semiconductor layer has a sheet resistance more than 300 ohms/□.

11. A logic circuit as claimed in claim 10, wherein said current source includes a constant voltage source generating a constant voltage free from an affection from an operating temperature variation, a fourth transistor having a collector connected with said collectors of said first and second transistors, a base receiving said constant voltage and a emitter and a fourth resistor connected between said emitter of said fourth transistor and said second power line, said fourth resistor being formed in said polycrystalline semiconductor layer formed on said semiconductor chip.

12. A circuit of emitter coupled logic comprising a current switch section formed of transistors and resistors and comparing a received input signal with a received reference voltage and an emitter follower output section formed of at least a transistor and a resistor and receiving the comparison result from said current switch section, said resistors in said current switch section having a temperature coefficient of resistance which is opposite sign to that of said resistor in said emitter follower output section.

13. A circuit of emitter coupled logic as claimed in claim 12, wherein while said resistors in said current switch section has a negative sign temperature coefficient of resistance, said resistors in said emitter follower output section has a positive sign temperature coefficient of resistance.

14. A circuit of emitter coupled logic as claimed in claim 13, wherein said current switch section and said emitter follower output section are formed on a semiconductor chip in a form of semiconductor integrated circuit, said resistors in said current switch section being formed in a polycrystalline semiconductor layer formed on said semiconductor chip, and said resistors in said emitter follower output section being formed in said semiconductor chip.

15. A circuit of emitter coupled logic as claimed in claim 14, wherein said polycrystalline semiconductor layer having a sheet resistance more than 300 ohms/□.

* * * * *